(12) United States Patent  
Nishihara et al.

(10) Patent No.: US 12,444,612 B2
(45) Date of Patent: Oct. 14, 2025

(54) SUBSTRATE PROCESSING METHOD AND SUBSTRATE PROCESSING APPARATUS

(71) Applicant: SCREEN Holdings Co., Ltd., Kyoto (JP)

(72) Inventors: Kazuki Nishihara, Kyoto (JP); Yuya Akanishi, Kyoto (JP); Masaki Inaba, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 282 days.

(21) Appl. No.: 17/950,774

(22) Filed: Sep. 22, 2022

(65) Prior Publication Data

US 2023/0100736 A1 Mar. 30, 2023

(30) Foreign Application Priority Data

Sep. 27, 2021 (JP) ................. 2021-156514

(51) Int. Cl.
H01L 21/311 (2006.01)
H01L 21/67 (2006.01)

(52) U.S. Cl.
CPC .. H01L 21/31116 (2013.01); H01L 21/67069 (2013.01)

(58) Field of Classification Search
None
See application file for complete search history.

(56) References Cited

U.S. PATENT DOCUMENTS

| | | | | |
|---|---|---|---|---|
| 5,268,069 A | * | 12/1993 | Chapple-Sokol | H01L 21/02049 257/E21.252 |
| 6,270,634 B1 | * | 8/2001 | Kumar | H01J 37/32935 216/68 |
| 8,187,486 B1 | * | 5/2012 | Liu | H01L 21/02063 438/723 |
| 9,691,631 B2 | | 6/2017 | Toda et al. | |
| 2016/0079081 A1 | | 3/2016 | Toda et al. | |
| 2020/0234968 A1 | * | 7/2020 | Zhang | H01L 21/31116 |
| 2021/0175089 A1 | | 6/2021 | Nishihara et al. | |
| 2021/0230750 A1 | | 7/2021 | Woo | |
| 2021/0375634 A1 | | 12/2021 | Suzuki et al. | |

FOREIGN PATENT DOCUMENTS

| | | |
|---|---|---|
| JP | 2016062947 A | 4/2016 |
| JP | 2019114628 A | 7/2019 |
| JP | 2021-005699 A | 1/2021 |
| JP | 2021089973 A | 6/2021 |
| JP | 2021-118250 A | 8/2021 |
| JP | 2021125666 A | 8/2021 |

* cited by examiner

Primary Examiner — Shamim Ahmed
(74) Attorney, Agent, or Firm — OSTROLENK FABER LLP

(57) ABSTRACT

In a substrate processing method, a silicon oxide film formed on a substrate is etched. The substrate processing method includes a first etching step and a second etching step. In the first etching step, the silicon oxide film is selectively etched against another film by supplying a hydrogen fluoride gas into a chamber in a state in which a pressure in the chamber is a first pressure lower than the atmospheric pressure. In the second etching step, the silicon oxide film is selectively etched against the another film by supplying the hydrogen fluoride gas into the chamber in a state in which the pressure in the chamber is a second pressure lower than the atmospheric pressure. The second pressure is lower than the first pressure.

2 Claims, 10 Drawing Sheets

SUBSTRATE PROCESSING METHOD AND SUBSTRATE PROCESSING APPARATUS

INCORPORATION BY REFERENCE

The present application claims priority under 35 U.S.C. § 119 to Japanese Patent Application No. 2021-156514, filed on Sep. 27, 2021. The contents of this application are incorporated herein by reference in their entirety.

BACKGROUND

The present disclosure relates to a substrate processing method and a substrate processing apparatus.

The etching method disclosed in Patent Literature (Japanese Patent Application Laid-Open Publication No. 2019-114628) includes: a step of preparing a substrate W with a CVD oxide film and an ALD oxide film formed thereon; a step of adjusting the temperature of the prepared substrate W to a first temperature greater than 0° C. and less than 100° C.; and selectively etching the CVD oxide film by supplying a hydrogen fluoride gas and water vapor to the surface of the substrate W of which temperature is adjusted to the first temperature.

When the temperature of the substrate W with the ALD oxide film and the CVD oxide film formed thereon is adjusted to the first temperature greater than 0° C. and less than 100° C. and then the substrate W is made in contact with the hydrogen fluoride gas and the water vapor, the CVD oxide film can be etched while the ALD oxide film is inhibited from being etched. As a result, etching of the CVD oxide film with a high selectivity ratio to the ALD oxide film can be achieved.

The inventors of the present application have made a new finding in connection with the etching method disclosed in the Patent Literature.

That is, the inventors of the present application have newly found that when etching processing on the same substrate is repeated plural times, reproducibility of etching result (e.g., amount of etching) may be insufficient.

SUMMARY

The present disclosure has its object of providing a substrate processing method and a substrate processing apparatus that can ensure reproducibility of etching result even when etching processing on the same substrate is repeated plural times.

According to an aspect of the present disclosure, in a substrate processing method, a silicon oxide film formed on a substrate is etched. The substrate processing method includes a first etching step and a second etching step. In the first etching step, the silicon oxide film is selectively etched against another film by supplying a hydrogen fluoride gas into a chamber in a state in which a pressure in the chamber is a first pressure lower than an atmospheric pressure. In the second etching step, the silicon oxide film is selectively etched against the another film by supplying the hydrogen fluoride gas into the chamber in a state in which the pressure in the chamber is a second pressure lower than the atmospheric pressure. The second pressure is lower than the first pressure.

In the aspect of the present disclosure, the first etching step and the second etching step preferably constitute a two-step etching processing step. Preferably, the two-step etching processing step is executed plural times.

In the aspect of the present disclosure, the second pressure is preferably no greater than 50 [Torr].

In the aspect of the present disclosure, the first pressure is preferably no greater than 600 [Torr] and at least 100 [Torr].

In the aspect of the present disclosure, it is preferable that in the second etching step, the silicon oxide film is etched while a reaction product generated on the silicon oxide film in the first etching step is sublimated.

According to another aspect of the present disclosure, a substrate processing apparatus performs etching with a hydrogen fluoride gas on a silicon oxide film formed on a substrate. The substrate processing apparatus includes a chamber, a hydrogen fluoride supply mechanism, a pressure controller, and a controller. The substrate is to be placed in the chamber. The hydrogen fluoride supply mechanism supplies the hydrogen fluoride gas into the chamber. The pressure controller controls a pressure in the chamber. The controller controls the pressure controller. The controller controls the pressure controller so that the pressure in the chamber reaches a first pressure lower than an atmospheric pressure. The controller controls the hydrogen fluoride supply mechanism to supply the hydrogen fluoride gas into the chamber in a state in which the pressure in the chamber is the first pressure. The controller controls the pressure controller so that the pressure in the chamber reaches a second pressure lower than the atmospheric pressure. The controller controls the hydrogen fluoride supply mechanism to supply the hydrogen fluoride gas into the chamber in a state in which the pressure in the chamber is the second pressure. The second pressure is lower than the first pressure.

DETAILED DESCRIPTION

Figure 1:
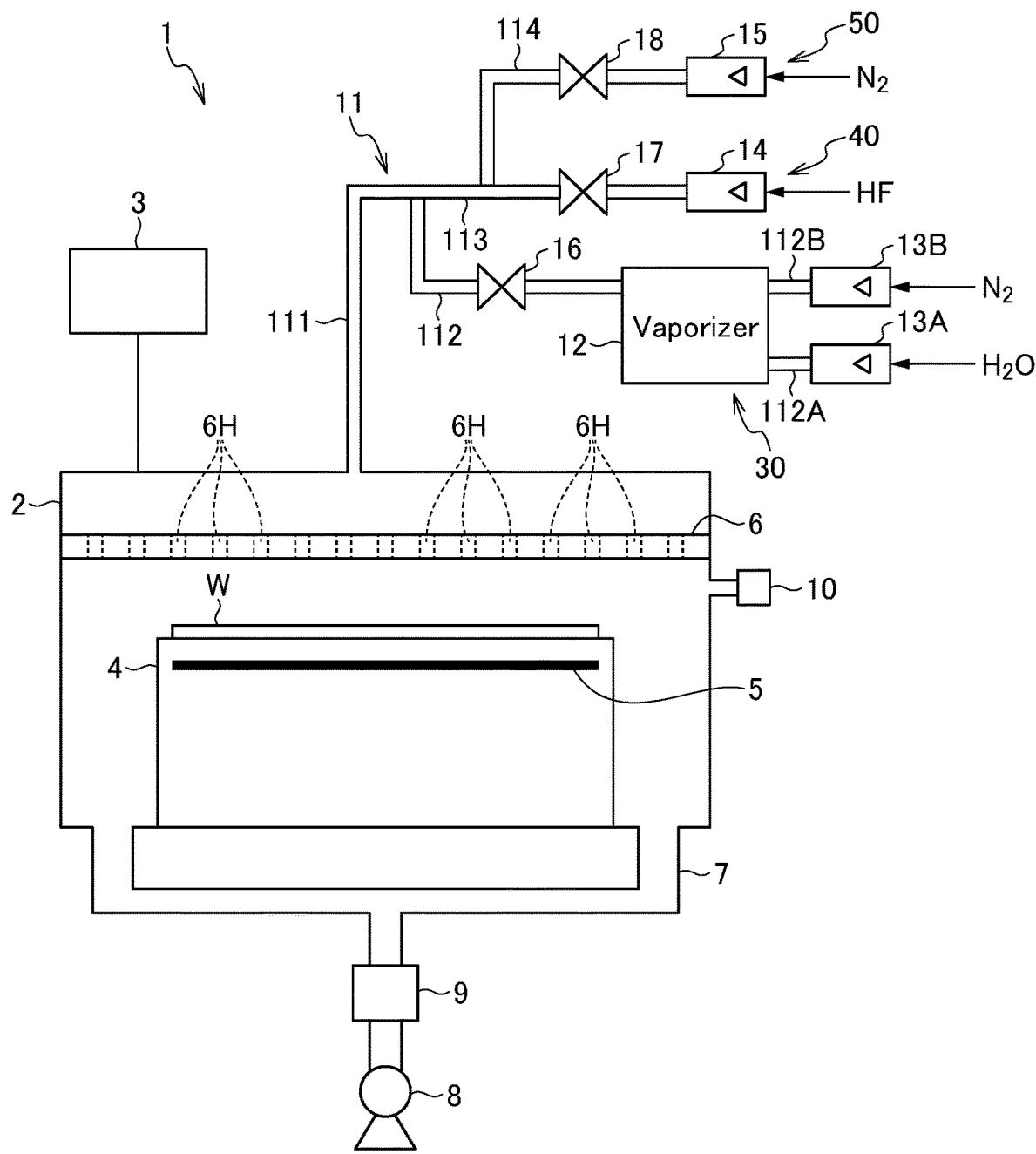
FIG. 1 is a side view of the interior of a substrate processing apparatus according to an embodiment of the present disclosure.

The following describes an embodiment of the present disclosure with reference to the accompanying drawings. Note that elements that are the same or equivalent are indicated by the same reference signs in the drawings and description thereof is not repeated.

Furthermore, words (e.g., "in a direction", "along a direction", "parallel", "perpendicular", "center", "concentric", and "coaxial") expressing a relative or absolute positional relationship encompass not only its strict positional relationship but also a positional relationship with relative deviation in angle or distance within a range of tolerance or to the extent that comparable functionality is obtained unless otherwise stated. Words (e.g., "the same", "equal", and "uniform") expressing a state of being equal encompass not only a quantitatively strictly equal state but also an equal state with tolerance or an error to the extent that comparable functionality is obtained unless otherwise stated. Words (e.g., "rectangular" and "cylindrical") expressing a shape encompass not only a geometrically strict shape but also a shape with irregularity or a chamfer within a range to the extent that comparable effects is obtained unless otherwise stated. Words "including", "having", and "comprising" an element is not exclusive expression that excludes the presence of another element. Words "at least one of A, B, and C" encompass "only A", "only B", "only C", "any two of A, B, and C", and "all of A, B, and C". The above is not limited to a case with three selective elements (A, B, and C) and the same applies for a case with two elements and a case with four or more elements.

With reference to FIGS. 1 to 7, a substrate processing apparatus 1 according to an embodiment of the present disclosure will be described. The substrate processing apparatus 1 will be described first with reference to FIG. 1. FIG. 1 is a side view of the interior of the substrate processing apparatus 1 according to the present embodiment.

As illustrated in FIG. 1, the substrate processing apparatus 1 is a substrate processing apparatus of single wafer type that performs etching processing on substrates W of for example a semiconductor wafer one at a time. The substrate processing apparatus 1 is a vapor substrate processing apparatus not using plasma, for example. In the present embodiment, the substrate processing apparatus 1 etches a silicon oxide film formed on the substrate W with a hydrogen fluoride gas (also referred to below as "HF gas").

The substrate processing apparatus 1 is applicable to a part of an apparatus for semiconductor device production. Note that the substrates W is not limited to substrates for semiconductor device use. Examples of the substrates W include a substrate for liquid crystal display apparatus use, a substrate for plasma display use, a substrate for field emission display (FED) use, a substrate for optical disk use, a substrate for magnetic disk use, a substrate for magneto-optical disk use, a substrate for photomask use, a ceramic substrate, and a substrate for solar cell use. In the following, each substrate W is a silicon substrate as an example.

On a surface of the substrate W, a silicon oxide film is formed in a former step before the substrate W is carried into the substrate processing apparatus 1, for example. However, no particular limitations are placed on the place where the silicon oxide film is formed. Examples of the silicon oxide film includes a silicon thermal oxide film, a tetraethoxysilane (TEOS) film, a boron silicate glass (BSG) film, a phosphosilicate glass (PSG) film, a boron doped phosphosilicate glass (BPSG) film, and an atomic layer deposition (ALD) oxide film.

The silicon thermal oxide film is formed by a method in which oxidation is performed on a substrate W from the surface to the interior thereof, for example. Specifically, the substrate W is exposed to oxygen or water vapor in a high-temperature atmosphere to cause a chemical reaction between silicon (Si) and oxygen ($O_2$), thereby forming a thin film (thermal oxide film) of silicon dioxide ($SiO_2$). The silicon thermal oxide film is dense. That is, the density (film density) of the silicon thermal oxide film is high.

The TEOS film, the BSG film, the PSG film, and the BPSG film are formed by the chemical vapor deposition (CVD) method, for example. In the CVD method, for example, a substrate W is exposed to a material gas containing a component of a target thin film to cause a chemical reaction on the substrate W by heat or plasma. Through the chemical reaction, the target thin film is formed on the substrate W. In a case of formation of a BSG film by the CVD method, for example, boron (B) is contained in the material gas. The TEOS film, the BSG film, the PSG film, and the BPSG film each have a density (film density) lower than that of the thermal oxide film. The ALD oxide film is formed by the atom layer deposition (ALD) method.

In the ALD method, a substrate W placed in a chamber is exposed to a precursor A first. Subsequently, the precursor A in the chamber is removed by purging, and then the substrate W is exposed to another precursor B (e.g., ozone). Thereafter, purging is re-performed to remove the precursor B in the chamber. Repetition of the above processes forms a 1-molecule-thick layer on a layer-by-layer basis. Specifically, aminosilane is used as the material gas (precursor A) in a case in which a silicon oxide film is a film formation target as the ALD oxide film, while trimethyl aluminum is used as the material gas in a case in which an aluminum oxide ($Al_2O_3$) film is the film formation target. The ALD oxide film has a density (film density) lower than that of the thermal oxide film.

The substrate processing apparatus 1 etches a silicon oxide film formed on a substrate W in the present embodiment.

In the following, the silicon oxide film that is an etching target of the substrate processing apparatus 1 may be referred to as "silicon oxide film TG".

In one example, not only the silicon oxide film TG but also another film (also referred to below as "another film FL") is formed on the surface of the substrate W. The another film FL is formed in another former step before the substrate W is carried into the substrate processing apparatus 1, for example. However, no particular limitations are placed on the place where the another film FL is formed. Furthermore, no particular limitations are placed on the another film FL and the another film FL may be a silicon oxide film other than the silicon oxide film TG or a film other than a silicon oxide film. For example, the silicon oxide film TG is a silicon thermal oxide film and the another film FL is a TEOS film, a BSG film, a PSG film, a BPSG film, or an ALD oxide film.

In one example, the silicon oxide film TG and the another film FL are exposed on the surface of the substrate W. The substrate processing apparatus 1 selectively etches the silicon oxide film TG against the another film FL.

The substrate processing apparatus 1 includes a chamber 2, a controller 3, a substrate holder 4, a heating mechanism 5 for the substrate W, a gas dispersing plate 6, an exhaust pipe 7, a vacuum pump 8, a pressure control valve 9, a pressure sensor 10, a gas supply pipe 11, a water vapor supply section 30, a hydrogen fluoride (HF) supply mechanism 40, and a nitrogen supply section 50.

The chamber 2 is hollow and capable of accommodating the substrate W. That is, the substrate W is to be placed in the chamber 2. The internal space of the chamber 2 corresponds to a processing compartment in which etching processing is performed on the substrate W.

The controller 3 controls the substrate holder 4, the heating mechanism 5, the vacuum pump 8, the pressure control valve 9, the pressure sensor 10, the water vapor supply section 30, the HF supply mechanism 40, and the nitrogen supply section 50.

The controller 3 includes a processor and storage. The processor is a central processing unit (CPU) or a microprocessing unit (MPU), for example. The storage stores data and a computer program therein. The storage includes a main storage device and an auxiliary storage device. The main storage device is semiconductor memory, for example. The auxiliary storage device is semiconductor memory, a solid state drive, or a hard disk drive, for example. The storage may include a removable medium. The storage corresponds to one example of a non-transitory computer-readable storage medium.

The substrate holder 4, the heating mechanism 5, the gas dispersing plate 6, and the pressure sensor 10 are disposed in the chamber 2.

The substrate holder 4 holds the substrate W in a substantially horizontal posture in the chamber 2. The words "horizontal posture" express a state of the substrate W being in parallel to a horizontal plane. The substrate W is carried into the chamber 2 from the outside by a non-illustrated transport mechanism, and placed on the substrate holder 4. The substrate holder 4 may hold the substrate W by sucking the substrate W or pinching the periphery of the substrate W using a plurality of chuck pins. Note that the substrate holder 4 does not necessarily hold the substrate W and may simply support the substrate W. That is, the substrate holder 4 may be a placement table on which the substrate W is to be placed.

The heating mechanism 5 heats the substrate W held by the substrate holder 4. Specifically, the heating mechanism 5 heats the substrate W to set the temperature of the substrate W to a target temperature. In the example illustrated in FIG. 1, the heating mechanism 5 is built in the substrate holder 4. The heating mechanism 5 is an electric heater of resistive heating type, for example. Note that the heating mechanism 5 may include a lamp instead of the electric heater, for example. The temperature of the substrate W may be set to the target temperature by irradiating the substrate W with infrared light of the lamp.

The gas dispersing plate 6 is disposed above the substrate holder 4 in the chamber 2. The gas dispersing plate 6 is disposed between the substrate holder 4 and the discharge port of the gas supply pipe 11 in the chamber 2. The gas dispersing plate 6 is plate-shaped so as to horizontally extend in the chamber 2. The gas dispersing plate 6 has a plurality of openings 6H. Specifically, the openings 6H penetrating the gas dispersing plate 6 in the thickness direction of the gas dispersing plate 6 are formed in a dispersed manner in the horizontal direction.

The exhaust pipe 7 is connected to the chamber 2. In the example illustrated in FIG. 1, the exhaust pipe 7 is connected to the bottom of the chamber 2 in a manner communicable with the interior of the chamber. The vacuum pump 8 is connected to the exhaust pipe 7. The vacuum pump 8 sucks the air in the chamber 2 through the exhaust pipe 7 to reduce the pressure in the chamber 2. Specifically, the vacuum pump 8 reduces the pressure in the chamber 2 to vacuum the interior of the chamber 2. The term vacuum means a state of the chamber 2 under a pressure lower than the atmospheric pressure. In one example, the vacuum means a state in which the pressure in the chamber 2 is no greater than 600 [Torr].

The pressure control valve 9 is disposed in the exhaust pipe 7. The pressure control valve 9 adjusts the exhaust flow rate of the air in the chamber 2 by adjusting the opening of the exhaust pipe 7. As a result, the pressure in the chamber 2 is adjusted. That is, the pressure control valve 9 controls the pressure in the chamber 2 by adjusting the exhaust flow rate of the air in the chamber 2. The pressure control valve 9 is an auto-pressure controller (APC) valve, for example. The pressure control valve 9 corresponds to one example of a "pressure controller" in the present disclosure.

Specifically, the pressure control valve 9 controls the degree of vacuum in the chamber 2 by adjusting the opening of the exhaust pipe 7. That is, the pressure control valve 9 controls the degree of vacuum in the chamber 2 by adjusting the exhaust flow rate of the air in the chamber 2.

The degree of vacuum is a degree of vacuum in the chamber 2. That is, the degree of vacuum serves as an indicator indicating the vacuum state in the chamber 2. In one example, the degree of vacuum is indicated as the pressure in the chamber 2. The higher the degree of vacuum is, the lower the pressure in the chamber 2 is and the higher vacuum state the interior of the chamber 2 is in. By contrast, the lower the degree of vacuum is, the higher the pressure in the chamber 2 is and the lower vacuum state the interior of the chamber 2 is in.

The pressure sensor 10 is connected to the chamber 2, and detects the pressure in the chamber 2. The pressure sensor 10 outputs an electric signal indicating the detected pressure in the chamber 2 to the controller 3. The controller 3 controls the pressure control valve 9 so that the pressure detected by the pressure sensor 10 reaches a target pressure. In the present embodiment, the target pressure is a first pressure P1, a second pressure P2, or a third pressure P3, which will be described later.

In other words, the controller 3 controls the pressure control valve 9 based on a result of detection by the pressure sensor 10. Specifically, the controller 3 controls the pressure control valve 9 so that the pressure detected by the pressure sensor 10 reaches a target degree of vacuum. In the present embodiment, the target degree of vacuum is a first degree VC1 of vacuum, a second degree VC2 of vacuum, or a third degree VC3 of vacuum, which will be described later.

After the substrate W is held by the substrate holder 4, the vacuum pump 8 operates to start vacuuming the interior of the chamber 2. The vacuum pump 8 is adopted as a means for reducing the pressure in the chamber 2, which should not be taken to limit the present embodiment. For example, pressure reduction may be performed by factory utility exhaust. In short, the specific configuration of the exhaustion section that exhausts the air in the chamber 2 is changeable as appropriate.

The gas supply pipe 11 is connected to the chamber 2. In the example illustrated in FIG. 1, the gas supply pipe 11 is connected to the upper part of the chamber 2 in a manner communicable with the interior of the chamber 2. In the example illustrated in FIG. 1, the gas supply pipe 11 includes a common pipe 111 and branch pipes 112 to 114. The common pipe 111 has one end connected to the upper part of the chamber 2.

The branch pipe 112 connects the water vapor supply section 30 to the common pipe 111. The water vapor supply section 30 vaporizes water to generate water vapor. The water vapor supply section 30 supplies the generated water vapor into the chamber 2 through the gas supply pipe 11 (the branch pipe 112 and the common pipe 111).

Specifically, the water vapor supply section 30 includes a vaporizer 12, a water flow rate controller 13A, a nitrogen gas flow rate controller 13B, and an opening and closing valve 16. The controller 3 controls the vaporizer 12, the water flow rate controller 13A, the nitrogen gas flow rate controller 13B, and the opening and closing valve 16.

The branch pipe 112 connects the vaporizer 12 to the common pipe 111. The vaporizer 12 vaporizes water to generate water vapor. Pipes 112A and 112B are connected to the vaporizer 12. The pipe 112A is connected to a non-illustrated water supply source. The water is supplied to the vaporizer 12 through the pipe 112A. The water flow rate controller 13A is disposed in the pipe 112A. The water flow rate controller 13A controls the flow rate of the water to be supplied to the vaporizer 12. The pipe 112B is connected to a non-illustrated nitrogen supply source. A nitrogen gas is supplied to the vaporizer 12 through the pipe 112B. The nitrogen gas flow rate controller 13B is disposed in the pipe 112B. The nitrogen gas flow rate controller 13B controls the flow rate of the nitrogen gas to be supplied to the vaporizer 12. The water flow rate controller 13A and the nitrogen gas flow rate controller 13B each are a mass flow controller, for example.

The vaporizer 12 generates water vapor by vaporizing the water supplied through the pipe 112A, and supplies the generated water vapor to the branch pipe 112. As a result of the water flow rate controller 13A controlling the flow rate of the water, the flow rate of the water vapor to be supplied to the branch pipe 112 from the vaporizer 12 is adjusted. That is, control of the water flow rate by the water flow rate controller 13A adjusts the flow rate of the water vapor to be supplied into the chamber 2 from the vaporizer 12.

The opening and closing valve 16 is disposed in the branch pipe 112. The opening and closing valve 16 opens and closes the flow channel of the branch pipe 112. As a result of the opening and closing valve 16 opening the flow channel of the branch pipe 112, the water vapor generated in the vaporizer 12 is supplied into the chamber 2 through the gas supply pipe 11 (the branch pipe 112 and the common pipe 11). In this case, the nitrogen gas supplied from the pipe 112B is used as a carrier gas of the water vapor. As such, the nitrogen gas transports the water vapor generated in the vaporizer 12 into the chamber 2 through the gas supply pipe 11 (the branch pipe 112 and the common pipe 111).

The branch pipe 113 connects the HF supply mechanism 40 to the common pipe 111. The HF supply mechanism 40 supplies a hydrogen fluoride gas (HF gas) into the chamber 2 through the gas supply pipe 11 (the branch pipe 113 and the common pipe 111).

Specifically, the HF supply mechanism 40 includes a hydrogen fluoride gas (HF gas) flow rate controller 14 and an opening and closing valve 17. The controller 3 controls the HF gas flow rate controller 14 and the opening and closing valve 17.

The branch pipe 113 connects a non-illustrated hydrogen fluoride (HF) supply source to the common pipe 111. The HF supply source supplies the HF gas into the branch pipe 113. The HF gas may be an anhydrous HF gas, for example. The anhydrous HF gas is a HF gas with little water, and has a water content (volume ratio) of no greater than several tens (e.g., 10) of vol.ppm, for example. The HF gas flow rate controller 14 is disposed in the branch pipe 113. The HF gas flow rate controller 14 controls the flow rate of the HF gas to be supplied into the chamber 2. The HF gas flow rate controller 14 is a mass flow controller, for example.

The opening and closing valve 17 is disposed in the branch pipe 113. The opening and closing valve 17 opens and closes the flow channel of the branch pipe 113. As a result of the opening and closing valve 17 opening the flow channel of the branch pipe 113, the HF gas is supplied into the chamber 2 from the gas supply pipe 11 (the branch pipe 113 and the common pipe 111). Control of the flow rate of the HF gas by the HF gas flow rate controller 14 adjusts the flow rate of the HF gas to be supplied into the chamber 2.

The branch pipe 114 connects the nitrogen supply section 50 to the common pipe 111. The nitrogen supply section 50 supplies a nitrogen gas into the chamber 2 through the gas supply pipe 11 (the branch pipe 114 and the common pipe 111).

Specifically, the nitrogen supply section 50 includes a nitrogen gas flow rate controller 15 and an opening and closing valve 18. The controller 3 controls the nitrogen gas flow rate controller 15 and the opening and closing valve 18.

The branch pipe 114 connects a non-illustrated nitrogen supply source to the common pipe 111. The nitrogen supply source supplies the nitrogen gas into the branch pipe 114. The nitrogen gas also contains little water, and has a water content (volume ratio) of no greater than several tens (e.g., 10) of vol.ppm, for example. The nitrogen gas flow rate controller 15 is disposed in the branch pipe 114. The nitrogen gas flow rate controller 15 controls the flow rate of the nitrogen gas to be supplied into the chamber 2. The nitrogen gas flow rate controller 15 is a mass flow controller, for example.

The opening and closing valve 18 is disposed in the branch pipe 114. The opening and closing valve 18 opens and closes the flow channel of the branch pipe 114. As a result of the opening and closing valve 18 opening the flow channel of the branch pipe 114, the nitrogen gas is supplied into the chamber 2 from the gas supply pipe 11 (the branch pipe 114 and the common pipe 111). Control of the flow rate of the nitrogen gas by the nitrogen gas flow rate controller 15 adjusts the flow rate of the nitrogen gas to be supplied into the chamber 2.

The nitrogen gas supplied from the branch pipe 114 is suppled into the chamber 2 for pressure adjustment (degree of vacuum adjustment) in the chamber 2 or for purging the interior of the chamber 2 after the etching processing under reduced pressure. Note that an inert gas such as a rare gas (e.g., an argon gas) may be used instead of the nitrogen gas. The inert gas is a gas with poor reactivity to both the HF gas and the substrate W.

The water vapor (including the nitrogen gas as a carrier gas) and HF gas each supplied into the chamber 2 through the gas supply pipe 11 communicably connected to the interior space of the chamber 2 reach the substrate W through the gas dispersing plate 6. Specifically, a mixed gas of the water vapor (including the nitrogen gas as a carrier gas) and the HF gas that is supplied above the gas dispersing plate 6 in the chamber 2 passes through the openings 6H of the gas dispersing plate 6 and moves downward of the gas dispersing plate 6, thereby being uniformly supplied onto the substrate W. The openings 6H have an inner diameter of 0.1 mm, for example. The intervals between adjacent openings 6H are 5 mm, for example.

As a result of the water vapor and the HF gas flowing on the surface of the silicon oxide film TG of the substrate W, the silicon oxide film TG is etched. It is known that it is hydrogen fluoride ion ($HF_2^-$) that greatly contributes to etching of the silicon oxide film TG. $HF_2^-$ is generated through a reaction between a HF gas and water vapor ($H_2O$). Specifically, when the water vapor and the HF gas flow on the surface of the silicon oxide film TG of the substrate W, the silicon oxide film TG is selectively etched against the another film FL.

Note that although only one gas dispersing plate 6 is disposed in the chamber 2 in the example illustrated in FIG. 1, a plurality of gas dispersing plates 6 may be disposed in a vertically layered manner. In a case in which uniform action of the water vapor and the HF gas supplied into the chamber 2 on the substrate W is less required or in a case in which the water vapor and the HF gas can be rectified using an element other than the gas dispersing plate 6, the gas dispersing plate 6 can be dispensed with.

In order to facilitate understanding of the present embodiment, a result of etching in a comparative example and a result of etching in a basic experiment of the present embodiment (Example 1 of the present disclosure) will be described next with reference to FIGS. 2 and 3.

Figure 2:
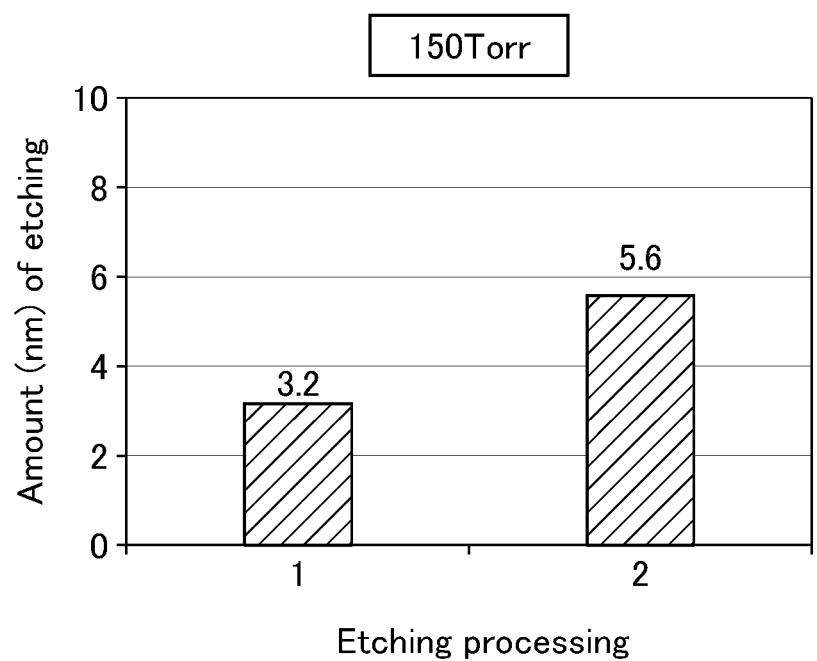
FIG. 2 is a graph representation showing amount of etching by etching processing according to a comparative example.

FIG. 2 is a graph representation showing amount of etching by etching processing according to the comparative example. The vertical axis indicates amount (nm) of etching. In the present specification, the amount of etching refers to a difference between the thickness of the silicon oxide film TG before etching and the thickness of the silicon oxide film TG after etching. The horizontal axis indicates the order of the etching processing.

In the comparative example, an experiment was carried out using a substrate processing apparatus having the same hardware configuration as that of the substrate processing apparatus 1 in FIG. 1. For the sake of explanation, the following describes each element of the substrate processing apparatus according to the comparative example with the same reference signs as those of the substrate processing apparatus 1 assigned thereto.

In the comparative example, the silicon oxide film TG formed on the substrate W was a low-pressure (LP)-TEOS film. The silicon oxide film TG was etched with the HF gas. The pressure in the chamber 2 was 150 [Torr]. The flow rate of the HF gas supplied into the chamber 2 from the HF supply mechanism 40 was 1 [slm]. The flow rate of the water vapor supplied into the chamber 2 from the water vapor supply section 30 was 1 [slm]. The flow rate of the nitrogen gas supplied into the chamber 2 from the nitrogen supply section 50 was 7 [slm]. "slm" represents "standard liter/minute" and is a unit indicating a flow rate per one minute in terms of liter. The temperature of the substrate W was 100 (° C.). The above conditions were the same for both first-time etching processing (horizontal axis: "1") and second-time etching processing (horizontal axis: "2").

The first-time etching processing (horizontal axis: "1") was carried out with the HF gas in the chamber 2. Once the first-time etching processing was completed, the substrate W was taken out of the chamber 2 and the film thickness of the silicon oxide film TG was measured. An amount of etching by the first-time etching processing was calculated based on the result of the film thickness measurement. As a result, the amount of etching by the first-time etching processing was 3.2 [nm]. The etching time was 300 seconds.

Next, the same substrate W, that is, the substrate subjected to the first-time etching processing, was returned into the chamber 2 and the second-time etching processing (horizontal axis: "2") was carried out under the same conditions as those in the first-time etching processing. After the second-time etching processing was completed, the substrate W was taken out of the chamber 2 and the film thickness of the silicon oxide film TG was measured. An amount of etching by the second-time etching processing was calculated based on the result of the film thickness measurement. As a result, the amount of etching by the second-time etching processing was 5.6 [nm]. The etching time was 300 seconds.

The difference between the amount of etching by the first-time etching processing and the amount of etching by the second-time etching processing was 2.4 [nm]. As such, where the pressure in the chamber 2 was 150 [Torr], reproducibility of amount of etching was insufficient between the first-time etching processing and the second-time etching processing.

The inventors of the present application presumed the reason why reproducibility of amount of etching was insufficient as follows. That is, the inventors of the present application presumed that a layer containing a reaction product generated in the first-time etching processing has remained on the surface of the silicon oxide film TG of the substrate W. The reaction product remaining on the surface of the silicon oxide film TG was a silicon fluoride-based reaction product. It was presumed for example that a mixed gas of the water vapor and the HF gas reacted with the silicon oxide film TG to generate the silicon fluoride-based reaction product. However, it was presumed that the reaction product remaining on the surface of the silicon oxide film TG might contain a reaction product different from the silicon fluoride-based reaction product. The inventors of the present application deduced that the reaction product remaining on the surface of the silicon oxide film TG has affected the second-time etching processing on the same substrate W to lead to insufficient reproducibility of amount of etching.

In view of the foregoing, a basic experiment (Example 1) of the present embodiment was carried out in a state in which the pressure in the chamber 2 was set to 50 [Torr], which was lower than 150 [Torr], in order to promote sublimation and exhaust of the reaction product for ensuring reproducibility of amount of etching.

Figure 3:
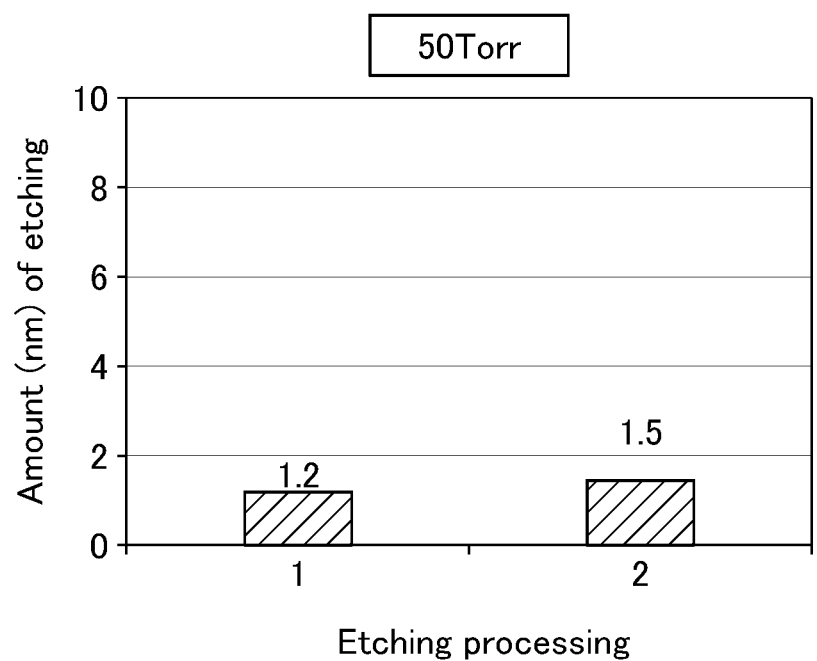
FIG. 3 is a graph representation showing amount of etching by etching processing according to Example 1 of the present disclosure.

FIG. 3 is a graph representation showing amount of etching by the etching processing according to Example 1 of the present disclosure. The vertical axis indicates amount (nm) of etching. The horizontal axis indicates the order of the etching processing.

In Example 1, the silicon oxide film TG formed on the substrate W was a LP-TEOS film. The silicon oxide film TG was etched with the HF gas. The pressure in the chamber 2 was 50 [Torr]. The flow rate of the HF gas supplied into the chamber 2 from the HF supply mechanism 40 was 1.5 [slm]. The flow rate of the water vapor supplied into the chamber 2 from the water vapor supply section 30 was 2 [slm]. The flow rate of the nitrogen gas supplied into the chamber 2 from the nitrogen supply section 50 was 4 [slm]. The temperature of the substrate W was 100 (° C.). The above conditions were the same for the first-time etching processing (horizontal axis: "1") and the second-time etching processing (horizontal axis: "2").

The first-time etching processing (horizontal axis: "1") was carried out with the HF gas in the chamber 2. Once the first-time etching processing was completed, the substrate W was taken out of the chamber 2 and the film thickness of the silicon oxide film TG was measured. An amount of etching by the first-time etching processing was calculated based on the result of the film thickness measurement. As a result, the amount of etching by the first-time etching processing was 1.2 [nm]. The etching time was 240 seconds.

Next, the same substrate W, that is, the substrate W subjected to the first-time etching processing, was returned into the chamber 2, and the second-time etching processing (horizontal axis: "2") was carried out under the same conditions as those in the first-time etching processing. After the second-time etching processing was completed, the substrate W was taken out of the chamber 2 and the film thickness of the silicon oxide film TG was measured. An amount of etching by the second-time etching processing was calculated based on the result of the film thickness measurement. As a result, the amount of etching by the second-time etching processing was 1.5 [nm]. The etching time was 240 seconds.

The difference between the amount of etching by the first-time etching processing and the amount of etching by the second-time etching processing was 0.3 [nm]. As such, where the pressure in the chamber 2 was 50 [Torr], reproducibility of amount of etching was ensured between the first etching processing and the second etching processing.

The inventors of the present application presumed the reason why reproducibility of amount of etching was ensured as follows. That is, when the pressure in the chamber 2 was reduced from 150 [Torr] to 50 [Torr], the melting point and the boiling point of the reaction product remaining on the surface of the silicon oxide film TG by the first-time etching processing were lowered. Therefore, the reaction product sublimated readily. In view of the foregoing, the inventors of the present application deduced that influence of the reaction product on etching was reduced as a result of sublimation and exhaust of the reaction product being promoted in the second-time etching processing. Therefore, reproducibility of amount of etching between the first-time etching processing and the second-time etching processing was ensured.

In view of the foregoing, the substrate processing apparatus 1 illustrated in FIG. 1 performs two-step etching processing in the present embodiment. The two-step etching processing is a step in which etching processing with the HF gas under a first pressure P1 is performed on the silicon oxide film TG and etching processing with the HF gas under a second pressure P2 is performed on the silicon oxide film TG after the etching processing with the HF gas under the first pressure P1 is performed on the silicon oxide film TG. In the present specification, the first pressure P1 is lower than the atmospheric pressure. The second pressure P2 is also lower than the atmospheric pressure. Furthermore, the second pressure P2 is lower than the first pressure P1.

In other words, the two-step etching processing is a step in which etching processing with the HF gas at a first degree VC1 of vacuum is performed on the silicon oxide film TG and etching processing with the HF gas at a second degree VC2 of vacuum is performed on the silicon oxide film TG after the etching processing with the HF gas at the first degree VC1 of vacuum is performed on the silicon oxide film TG. The second degree VC2 of vacuum indicates a degree of vacuum higher than the first degree VC1 of vacuum. The second degree VC2 of vacuum indicates the second pressure P2. Also, the first degree VC1 of vacuum indicates the first pressure P1.

Specifically, the controller 3 controls the pressure control valve 9 so that the pressure in the chamber 2 reaches the first pressure P1 that is lower than the atmospheric pressure. In response, the pressure control valve 9 sets the pressure in the chamber 2 to the first pressure P1.

In other words, the controller 3 controls the pressure control valve 9 so that the degree of vacuum in the chamber 2 reaches the first degree VC1 of vacuum. In response, the pressure control valve 9 sets the degree of vacuum in the chamber 2 to the first degree CV1 of vacuum.

Furthermore, the controller 3 controls the HF supply mechanism 40 to supply the HF gas into the chamber 2 in a state in which the pressure in the chamber 2 is the first pressure P1. In response, the HF supply mechanism 40 supplies the HF gas into the chamber 2 in a state in which the pressure in the chamber 2 is the first pressure P1. Accordingly, the silicon oxide film TG formed on the substrate W is etched with the HF gas under the first pressure P1. Specifically, the silicon oxide film TG is selectively etched with the HF gas against the another film FL under the first pressure P1.

In other words, the controller 3 controls the HF supply mechanism 40 to supply the HF gas into the chamber 2 in a state in which the degree of vacuum of the chamber 2 is the first degree VC1 of vacuum. In response, the HF supply mechanism 40 supplies the HF gas into the chamber 2 in a state in which the degree of vacuum of the chamber 2 is the first degree VC1 of vacuum. Accordingly, the silicon oxide film TG formed on the substrate W is etched with the HF gas at the first degree VC1 of vacuum. Specifically, the silicon oxide film TG is selectively etched against the another film FL with the HF gas in the chamber 2 at the first degree VC1 of vacuum.

Subsequently, the controller 3 controls the pressure control valve 9 so that the pressure in the chamber 2 reaches the second pressure P2 that is lower than the atmospheric pressure. In response, the pressure control valve 9 sets the pressure in the chamber 2 to the second pressure P2.

In other words, the controller 3 controls the pressure control valve 9 so that the degree of vacuum in the chamber 2 reaches the second degree VC2 of vacuum. In response, the pressure control valve 9 sets the degree of vacuum in the chamber 2 to the second degree VC2 of vacuum.

Furthermore, the controller 3 controls the HF supply mechanism 40 to supply the HF gas into the chamber 2 in a state in which the pressure in the chamber 2 is the second pressure P2. In response, the HF supply mechanism 40 supplies the HF gas into the chamber 2 in a state in which the pressure in the chamber 2 is the second pressure P2. Accordingly, the silicon oxide film TG formed on the substrate W is etched with the HF gas under the second pressure P2. Specifically, the silicon oxide film TG is selectively etched against the another film FL with the HF gas under the second pressure P2.

In other words, the controller 3 controls the HF supply mechanism 40 to supply the HF gas into the chamber 2 in a state in which the degree of vacuum in the chamber 2 is the second degree VC2 of vacuum. In response, the HF supply mechanism 40 supplies the HF gas into the chamber 2 in a state in which the degree of vacuum of the chamber 2 is the second degree VC2 of vacuum. Accordingly, the silicon oxide film TG formed on the substrate W is etched with the HF gas in the chamber 2 at the second degree VC2 of vacuum. Specifically, the silicon oxide film TG is selectively etched against the another film FL with the HF gas in the chamber 2 at the second degree VC2 of vacuum.

According to the present embodiment, the first-time etching processing under the first pressure P1 is followed by the second-time etching processing under the second pressure P2 lower than the first pressure P1 (two-step etching processing) as described above with reference to FIG. 1. Therefore, the melting point and the boiling point of the reaction product, which is derived from the HF gas, on the silicon oxide film TG are lowered in the second-time etching processing from those in the first-time etching processing. As a result, sublimation and exhaust of the reaction product generated on the silicon oxide film TG in the first-time etching processing are promoted in the second-time etching processing. This can reduce influence of the reaction product on the second-time etching processing to ensure reproducibility of amount of etching between the first-time etching processing and the second-time etching processing. That is, reproducibility of etching result can be ensured even when etching processing on the same substrate W is repeated plural times. Note that the reaction product on the silicon oxide film TG is a silicon fluoride-based reaction product. Furthermore, the reaction product on the silicon oxide film TG may include a reaction product other than the silicon fluoride-based reaction product.

That is, in the second-time etching processing of the two-step etching processing in the present embodiment, the silicon oxide film TG is selectively etched against the another film FL while the reaction product on the silicon oxide film TG is removed through sublimation.

Figure 4:
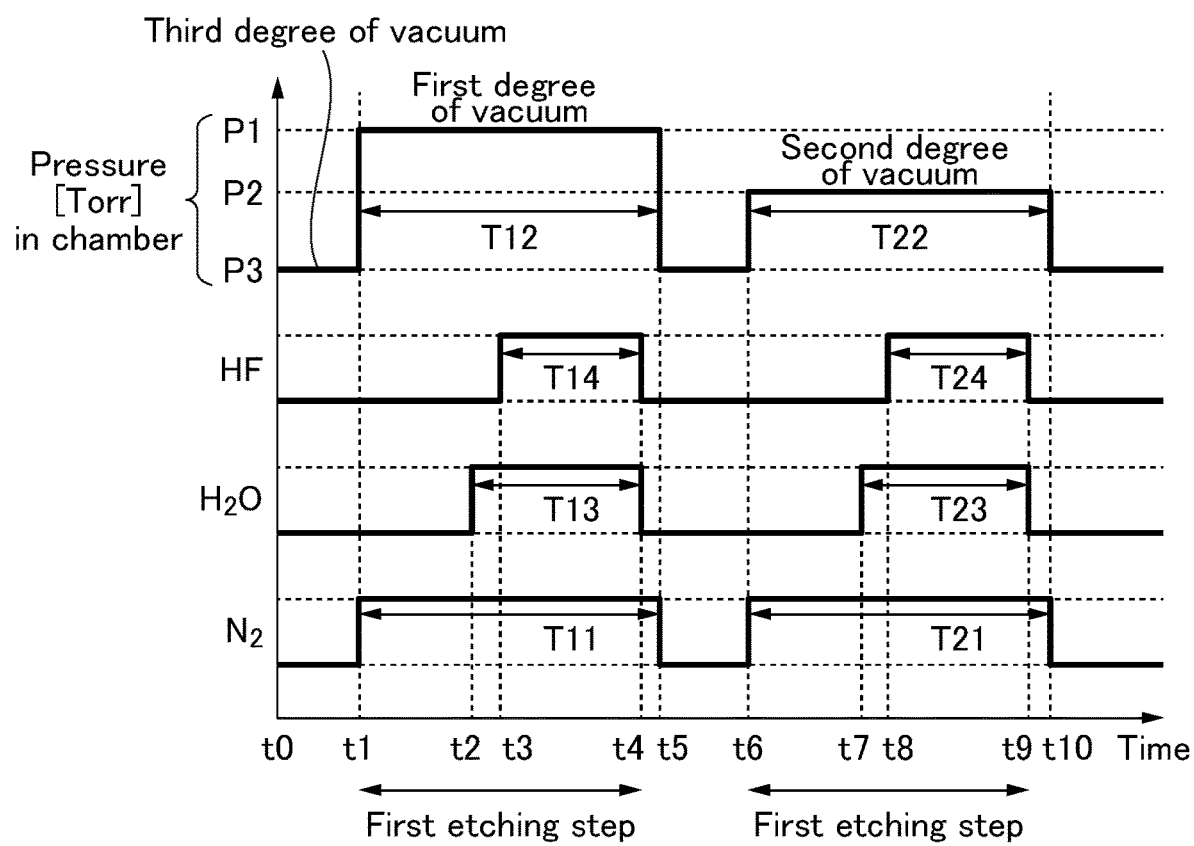
FIG. 4 is a time chart of two-step etching processing according to the embodiment.

The two-step etching processing will be described next in detail with reference to FIGS. 1 and 4. FIG. 4 is a time chart depicting the two-stage etching processing according to the present embodiment.

At a time t0, the vacuum pump 8 reduces the pressure in the chamber 2 and the pressure control valve 9 sets the pressure in the chamber 2 to the third pressure P3 as depicted in FIG. 4. In other words, the pressure control valve 9 sets the degree of vacuum in the chamber 2 to the third degree VC3 of vacuum. The third degree VC3 of vacuum indicates the third pressure P3. The third pressure P3 is $2 \times 10^{-2}$ [Torr], for example. At the time t0, the opening and closing valves 16 to 18 close the flow channels of the branch pipes 112 to 114, respectively.

At a time t1, the opening and closing valve 18 opens the flow channel of the branch pipe 114. As a result, the nitrogen gas is supplied into the chamber 2 from the nitrogen supply section 50. The nitrogen gas is supplied into the chamber 2 for a predetermined time period T11. Also at the time t1, the pressure control valve 9 sets the pressure in the chamber 2 to the first pressure P1. In other words, the pressure control valve 9 sets the degree of vacuum in the chamber 2 to the first degree VC1 of vacuum. The first degree VC1 of vacuum indicates the first pressure P1. The first pressure P1 is higher than the third pressure P3. As such, the first degree VC1 of vacuum indicates a degree of vacuum lower than the third degree VC3 of vacuum. The first pressure P1 is 150 [Torr], for example. In the chamber 2, the first pressure P1 (first degree VC1 of vacuum) is maintained for a predetermined time period T12.

At a time t2, the opening and closing valve 16 opens the flow channel of the branch pipe 112. As a result, the water vapor is supplied into the chamber 2 from the water vapor supply section 30. The water vapor is supplied into the chamber 2 for a predetermined time period T13.

At a time t3, the opening and closing valve 17 opens the flow channel of the branch pipe 113. As a result, the HF gas is supplied into the chamber 2 from the HF supply mechanism 40. Accordingly, etching of the silicon oxide film TG formed on the substrate W starts. The HF gas is supplied into the chamber 2 for a predetermined time period T14.

At a time t4, the opening and closing valve 16 closes the flow channel of the branch pipe 112 and the opening and closing valve 17 closes the flow channel of the branch pipe 113. As a result, supply of the water vapor and the HF gas into the chamber 2 stops. Accordingly, etching of the silicon oxide film TG formed on the substrate W ends.

At the time t5, the pressure control valve 9 sets the pressure in the chamber 2 to the third pressure P3. In other words, the pressure control valve 9 sets the degree of vacuum in the chamber 2 to the third degree VC3 of vacuum. Also, the opening and closing valve 18 closes the flow channel of the branch pipe 114. As a result, supply of the nitrogen gas into the chamber 2 from the nitrogen supply section 50 stops. During the time from the time t4 to the time t5, the air in the chamber 2 is purged with the nitrogen gas.

At a time t6, the opening and closing valve 18 opens the flow channel of the branch pipe 114. As a result, the nitrogen gas is supplied into the chamber 2 from the nitrogen supply section 50. The nitrogen gas is supplied into the chamber 2 for a predetermined time period T21. Also at the time t6, the pressure control valve 9 sets the pressure in the chamber 2 to the second pressure P2. In other words, the pressure control valve 9 sets the degree of vacuum in the chamber 2 to the second degree VC2 of vacuum. The second degree VC2 of vacuum indicates the second pressure P2. The second pressure P2 is higher than the third pressure P3 and lower than the first pressure P1. Accordingly, the second degree VC2 of vacuum indicates a degree of vacuum lower than the third degree VC3 of vacuum and higher than the first degree VC1 of vacuum. The second pressure P2 is 50 [Torr], for example. In the chamber 2, the second pressure P2 (second degree VC2 of vacuum) is maintained for a predetermined time period T22.

At a time t7, the opening and closing valve 16 opens the flow channel of the branch pipe 112. As a result, the water vapor is supplied into the chamber 2 from the water vapor supply section 30. The water vapor is supplied into the chamber 2 for a predetermined time period T23.

At a time t8, the opening and closing valve 17 opens the flow channel of the branch pipe 113. As a result, the HF gas is supplied into the chamber 2 from the HF supply mechanism 40. Accordingly, etching of the silicon oxide film TG formed on the substrate W starts. In etching in this time, the silicon oxide film TG is etched while the reaction product on the silicon oxide film TG is sublimated and exhausted. The HF gas is supplied into the chamber 2 for a predetermined time period T24.

At a time t9, the opening and closing valve 16 closes the flow channel of the branch pipe 112 and the opening and closing valve 17 closes the flow channel of the branch pipe 113. As a result, supply of the water vapor and the HF gas into the chamber 2 stops. Accordingly, etching of the silicon oxide film TG formed on the substrate W ends.

At a time t10, the pressure control valve 9 sets the pressure in the chamber 2 to the third pressure P3. In other words, the pressure control valve 9 sets the degree of vacuum in the chamber 2 to the third degree VC3 of vacuum. Also, the opening and closing valve 18 closes the flow channel of the branch pipe 114 at the time t10. As a result, supply of the nitrogen gas into the chamber 2 from the nitrogen supply section 50 stops. During the time from the time t9 to the time t10, the air in the chamber 2 is purged with the nitrogen gas.

In the following, processing from the time t1 to the time t4 may be referred to as "first etching step" and processing from the time t6 to the time t9 may be referred to as "second etching step" for the sake of explanation. Note that in carrying the substrate W out of the chamber 2 after completion of the second etching step, the vacuum pump 8 stops sucking and the pressure control valve 9 sets the pressure in the chamber 2 to the atmospheric pressure, for example. In doing so, the nitrogen supply section 50 preferably supplies the nitrogen gas into the chamber 2.

Note that the time at which the pressure in the chamber 2 is set to the first pressure P1 and the time at which the nitrogen gas is supplied in the first etching step are not limited to those illustrated in FIG. 4 and may be in any order. Also, the time at which the pressure in the chamber 2 is set to the second pressure P2 and the time at which the nitrogen gas is supplied in the second etching step are not limited to those illustrated in FIG. 4 and may be in any order. In each of the first etching step and the second etching step, the time at which the nitrogen gas is supplied and the time at which the HF gas is supplied are not limited to those illustrated in FIG. 4 and may be in any order or the same as each other. In each of the first etching step and the second etching step, the time at which supply of the HF gas stops and the time at which supply of the water vapor stops are not limited to those illustrated in FIG. 4 and may be in any order. Furthermore, in each of the first etching step and the second etching step, the time at which the pressure in the chamber 2 is set to the third pressure P3 and the time at which supply of the nitrogen gas stops are not limited to those illustrated in FIG. 4 and may be in any order.

The two-step etching processing has been described so far with reference to FIG. 4. In the second etching step in this case, the silicon oxide film TG is etched while the reaction product generated on the silicon oxide film TG in the first etching step is sublimated. Specifically, in the second etching step, the silicon oxide film TG is selectively etched against the another film FL while the reaction product generated on the silicon oxide film TG in the first etching step is sublimated. Therefore, influence of the reaction product on etching in the second etching step can be reduced with a result that reproducibility of amount of etching between the first etching step and the second etching step can be ensured.

Preferably, the second pressure P2 in the second etching step is no greater than 50 [Torr]. In the above preferable example, sublimation and exhaust of the reaction product (e.g., a silicon fluoride-based reaction product) can be promoted. Specifically, the second pressure P2 is no greater than 50 [Torr] and at least 1 [Torr].

Furthermore, the first pressure P1 in the first etching step is preferably no greater than 600 [Torr] and at least 100 [Torr]. In the above preferable example, the amount of etching in the first etching step can be greater than that in the second etching step. This is because the amount of etching of the silicon oxide film TG increases as the pressure in the chamber 2 is increased. This is clear from a comparison result between the amount (150 Torr) of etching by the first-time etching processing in FIG. 2 and the amount (50 Torr) of etching by the first-time etching processing in FIG. 3.

Next, a substrate processing method according to the present embodiment will be described with reference to FIGS. 1 and 5 to 7. In the substrate processing method, a silicon oxide film TG formed on a substrate W is etched. The substrate processing method is implemented by the substrate processing apparatus 1.

Figure 5:
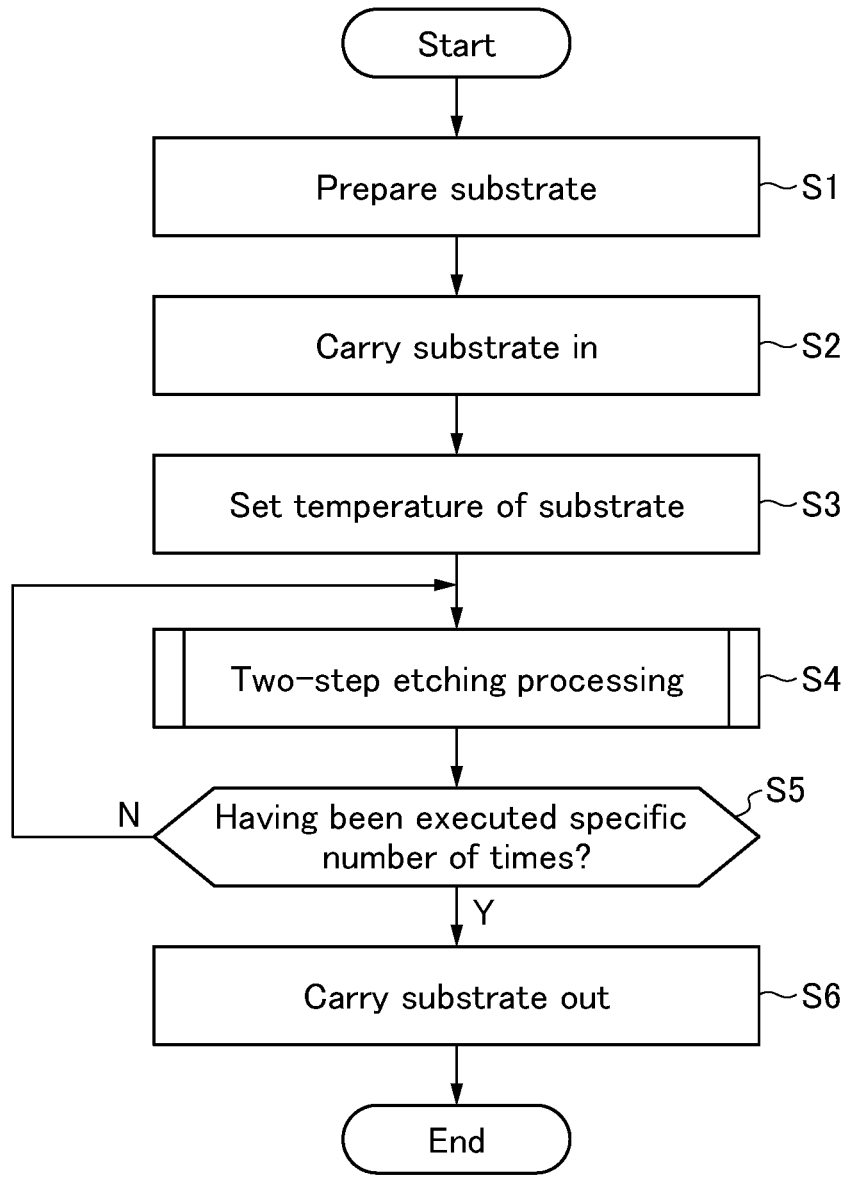
FIG. 5 is a flowchart depicting a substrate processing method according to the embodiment.

FIG. 5 is a flowchart depicting the substrate processing method according to the present embodiment. As depicted in FIG. 5, the substrate processing method includes steps S1 to S6.

In Step S1, a substrate W being an etching target of the substrate processing apparatus 1 is prepared. The silicon oxide film TG is formed on and exposed from the upper surface of the substrate W. Specifically, the silicon oxide film TG and another film FL are formed on and exposed from the upper surface of the substrate W.

Next in Step S2, the non-illustrated transport mechanism carries the substrate W into the chamber 2 and places the substrate W on the substrate holder 4. In this case, the substrate W is placed in a posture in which the surface with the silicon oxide film TG and the another film FL formed thereon faces upward.

Next in Step S3, the controller 3 controls the heating mechanism 5 to set the temperature of the substrate W to a target temperature. In response, the heating mechanism 5 heats the substrate W to set the temperature of the substrate W to the target temperature. The target temperature is higher than room temperature. The target temperature is 100° C., for example.

Next in Step S4, the substrate processing apparatus 1 performs the two-step etching processing. The two-step etching processing is processing in which etching with the hydrogen fluoride gas (HF gas) under the first pressure P1 is performed on the silicon oxide film TG and etching with the HF gas under the second pressure P2 is performed on the silicon oxide film TG after the etching with the HF gas under the first pressure P1 is performed on the silicon oxide film TG (see FIG. 4). Specifically, the two-step etching processing is processing in which selective etching with the HF gas under the first pressure P1 is performed on the silicon oxide film TG and selective etching with the HF gas under the second pressure P2 is performed on the silicon oxide film TG after the selective etching with the HF gas under the first pressure P1 is performed on the silicon oxide film TG.

In the following, Step S4 may be referred to as "two-step etching processing step S4".

Next in Step S5, the controller 3 determines whether or not the two-step etching processing in Step S4 has been executed a specific number NM of times.

If it is determined in Step S5 that the two-step etching processing has not been executed the specific number NM of times (No in Step S5), the routine returns to Step S4. As such, Step S4 is repeated until the two-step etching processing has been executed the specific number NM of times.

The specific number NM is 1, for example. However, the specific number NM may be plural (2 or greater).

If it is determined in Step S5 that the two-step etching processing has been executed the specific number NM of times (Yes in Step S5) by contrast, the routine proceeds to Step S6.

Next in Step S6, the non-illustrated transport mechanism carries the substrate W out of the chamber 2. The substrate processing method ends then.

Figure 6:
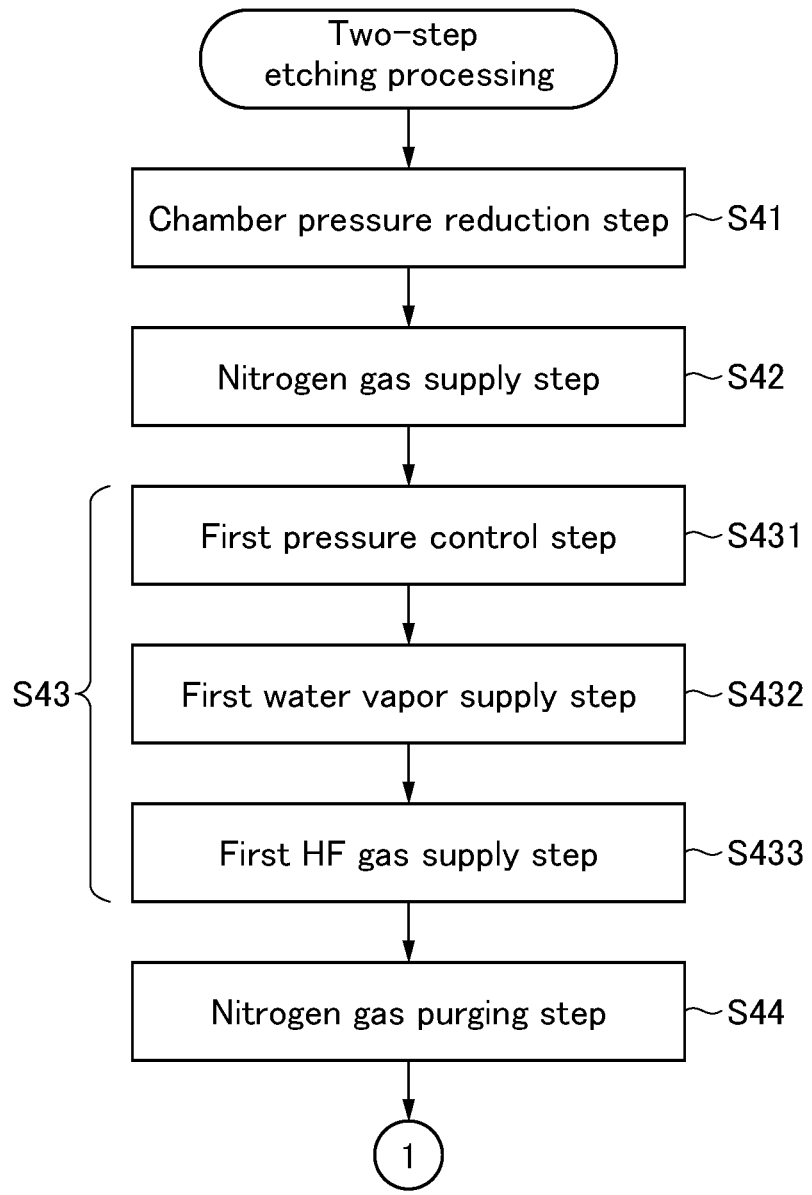
FIG. 6 is a flowchart depicting a former half of the two-step etching processing according to the present embodiment.
Figure 7:
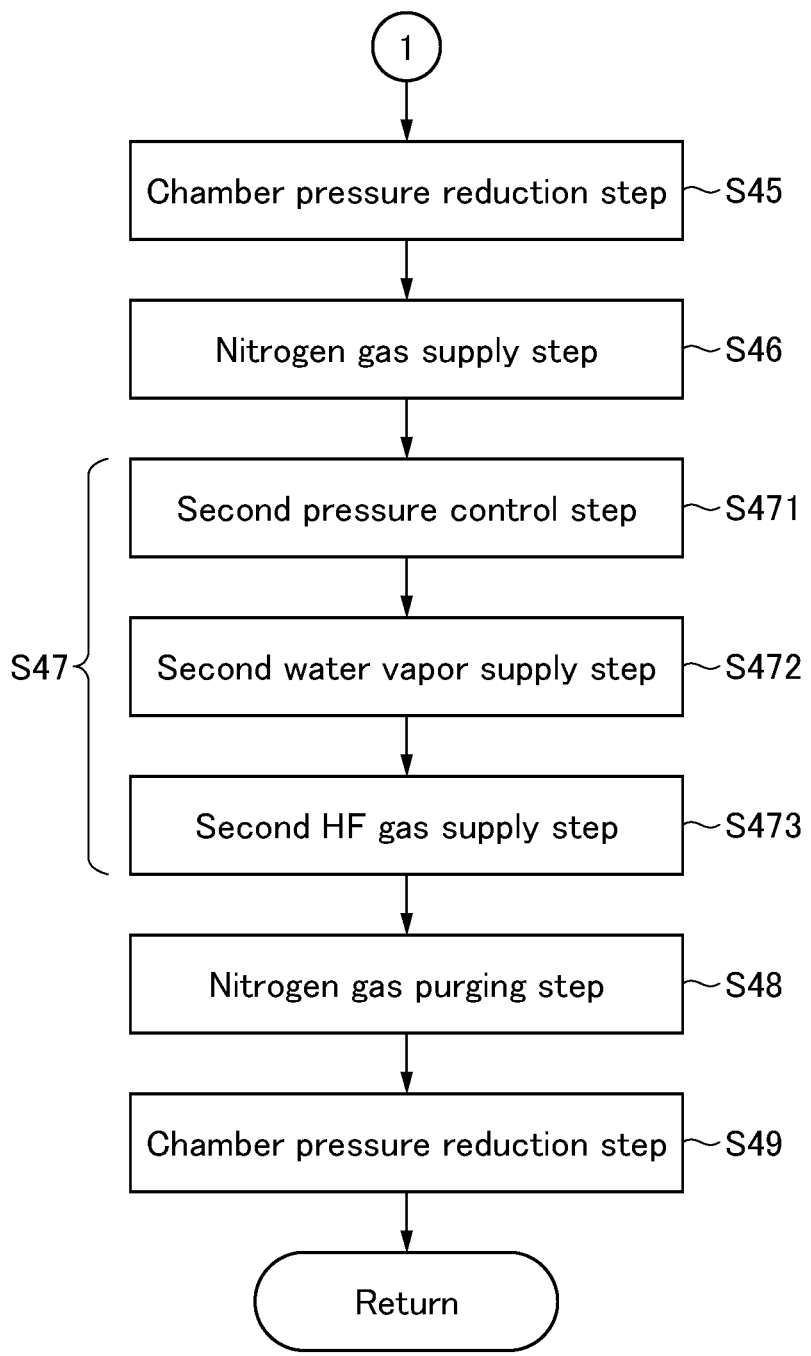
FIG. 7 is a flowchart depicting a latter half of the two-step etching processing according to the present embodiment.

Details of the two-step etching processing in Step S4 in FIG. 5 will be described next with reference to FIGS. 1, 6, and 7. FIGS. 6 and 7 are flowcharts depicting the two-step etching processing. As depicted in FIGS. 6 and 7, the two-step etching processing includes Steps S41 to S49. Before execution of Step S41, the opening and closing valves 16 to 18 are closed and the flow channel of the branch pipes 112 to 114 are closed.

As depicted in FIG. 6, the controller 3 activates the vacuum pump 8 first in Step S41. The controller 3 controls the pressure control valve 9 so that the degree of vacuum in the chamber 2 reaches the third degree VC3 of vacuum. In other words, the controller 3 controls the pressure control valve 9 so that the pressure in the chamber 2 reaches the third pressure P3 (FIG. 4). In response, the pressure control valve 9 sets the pressure in the chamber 2 to the third pressure P3. Step S41 may be referred to as "chamber pressure reduction step S41".

Next in Step S42, the controller 3 controls the nitrogen supply section 50 to supply the nitrogen gas into the chamber 2. In response, the nitrogen supply section 50 supplies the nitrogen gas into the chamber 2 through the opening and closing valve 18 opening the flow channel of the branch pipe 114. The nitrogen supply section 50 continues supplying the nitrogen gas until Step S44. Specifically, the nitrogen supply section 50 continues supplying the nitrogen gas for the predetermined time period T11 (FIG. 4). Step S42 may be referred to as "nitrogen gas supply step S42".

Next in Step S43, the substrate processing apparatus 1 performs first etching processing. The first etching processing is a processing in which the HF gas is supplied into the chamber 2 to selectively etch the silicon oxide film TG against the another film FL in a state in which the pressure in the chamber 2 is the first pressure P1 lower than the atmospheric pressure. In other words, the first etching processing is a processing in which the HF gas is supplied into the chamber 2 to selectively etch the silicon oxide film TG against the another film FL in a state in which the degree of vacuum in the chamber 2 is the first degree VC1 of vacuum. Step S43 may be referred to as "first etching step S43".

Specifically, Step S43 includes Steps S431 to S433.

First in Step S431, the controller 3 controls the pressure control valve 9 so that the pressure in the chamber 2 reaches the first pressure P1 lower than the atmospheric pressure (FIG. 4). In response, the pressure control valve 9 sets the pressure in the chamber 2 to the first pressure P1. Specifically, the pressure control valve 9 sets the pressure in the chamber 2 to the first pressure P1 for the predetermined time period T12 (FIG. 4) to maintain the degree of vacuum in the chamber 2 at the first degree VC1 of vacuum. Step S431 may be referred to as "first pressure control step S431".

Next in Step S432, the controller 3 controls the water vapor supply section 30 to supply water vapor into the chamber 2. In response, the water vapor supply section 30 generates water vapor using the vaporizer 12 and supplies the generated water vapor into the chamber 2 through the opening and closing valve 16 opening the flow channel of the branch pipe 112. The water vapor supply section 30 continues supplying the water vapor for the predetermined time period T13 (FIG. 4). Step S432 may be referred to as "first water vapor supply step S432".

Next in Step S433, the controller 3 controls the HF supply mechanism 40 to supply the HF gas into the chamber 2. In response, the HF supply mechanism 40 supplies the HF gas into the chamber 2 through the opening and closing valve 17 opening the flow channel of the branch pipe 113. The HF supply mechanism 40 continues supplying the HF gas for the predetermined time period T14 (FIG. 4). Step S433 may be referred to as "first HF gas supply step S433".

The mixed gas of the water vapor and the HF gas supplied in the chamber 2 passes through the openings 6H formed in the gas dispersing plate 6 and uniformly comes into contact with the entire surface of the substrate W. As a result, the silicon oxide film TG is selectively etched against the another film FL by the water vapor and the HF gas. Thereafter, when the HF supply mechanism 40 stops supplying the HF gas after the predetermined time period T14 elapses from the start of supply of the HF gas, the etching ends. That is, Step S43 (first etching step S43) ends.

Next in Step S44, the nitrogen supply section 50 continues supplying the nitrogen gas even after supply of the water vapor and the HF gas stops. As a result, the air in the chamber 2 is purged. After the predetermined time period T11 elapses from the start of the nitrogen gas supply in Step S42, the controller 3 controls the nitrogen supply section 50 to stop supplying the nitrogen gas. In response, the nitrogen supply section 50 stops supplying the nitrogen gas, thereby completing purging with the nitrogen gas. Step S44 may be referred to as "nitrogen gas purging step S44".

Next in Step S45, the controller 3 controls the pressure control valve 9 so that the degree of vacuum in the chamber 2 reaches the third degree VC3 of vacuum as depicted in FIG. 7. In other words, the controller 3 controls the pressure control valve 9 so that the pressure in the chamber 2 reaches the third pressure P3 (FIG. 4). In response, the pressure control valve 9 sets the pressure in the chamber 2 to the third pressure P3. Step S45 may be referred to as "chamber pressure reduction step S45".

Next in Step S46, the controller 3 controls the nitrogen supply section 50 to supply the nitrogen gas into the chamber 2. In response, the nitrogen supply section 50 supplies the nitrogen gas into the chamber 2 through the opening and closing valve 18 opening the flow channel of the branch pipe 114. The nitrogen supply section 50 continues supplying the nitrogen gas until Step S48. Specifically, the nitrogen supply section 50 continues supplying the nitrogen gas for the predetermined time period T21 (FIG. 4). Step S46 may be referred to as "nitrogen gas supply step S46".

Next in Step S47, the substrate processing apparatus 1 performs the second etching processing. The second etching processing is processing in which selective etching of the silicon oxide film TG is performed against the another film FL by supplying the HF gas into the chamber 2 in a state in which the pressure in the chamber 2 is the second pressure P2 lower than the atmospheric pressure. In other words, the second etching processing is processing in which selective etching of the silicon oxide film TG is performed against the another film FL by supplying the HF gas into the chamber 2 in a state in which the degree of vacuum in the chamber 2 is the second degree VC2 of vacuum. Step S47 may be referred to as "second etching step S47".

Specifically, Step S47 includes Steps S471 to S473.

First in Step S471, the controller 3 controls the pressure control valve 9 so that the pressure in the chamber 2 reaches the second pressure P2 lower than the atmospheric pressure (FIG. 4). In response, the pressure control valve 9 sets the pressure in the chamber 2 to the second pressure P2. Specifically, the pressure control valve 9 sets the pressure in the chamber 2 to the second pressure P2 for the predetermined time period T22 (FIG. 4) to maintain the degree of vacuum in the chamber 2 at the second degree VC2 of vacuum. Step S471 may be referred to as "second pressure control step S471".

Next in Step S472, the controller 3 controls the water vapor supply section 30 to supply water vapor into the chamber 2. In response, the water vapor supply section 30 generates water vapor using the vaporizer 12 and supplies the generated water vapor into the chamber 2 through the opening and closing valve 16 opening the flow channel of the branch pipe 112. The water vapor supply section 30 continues supplying the water vapor for the predetermined time period T23 (FIG. 4). Step S472 may be referred to as "second water vapor supply step S472".

Next in Step S473, the controller 3 controls the HF supply mechanism 40 to supply the HF gas into the chamber 2. In response, the HF supply mechanism 40 supplies the HF gas into the chamber 2 through the opening and closing valve 17 opening the flow channel of the branch pipe 113. The HF supply mechanism 40 continues supplying the HF gas for the predetermined time period T24 (FIG. 4). Step S473 may be referred to as "second HF gas supply step S473".

The mixed gas of the water vapor and the HF gas supplied in the chamber 2 passes through the openings 6H in the gas dispersing plate 6 and uniformly comes in contact with the entire surface of the substrate W. As a result, the water vapor and the HF gas selectively etch the silicon oxide film TG against the another film FL. Thereafter, when the HF supply mechanism 40 stops supplying the HF gas after the predetermined time period T24 elapses from the start of supply of the HF gas, etching ends. That is, Step S47 (second etching step S47) ends.

Next in Step S48, the nitrogen supply section 50 continues supplying the nitrogen gas even after stop of supply of the water vapor and the HF gas. As a result, the air in the chamber 2 is purged. After the predetermined time period T21 elapses from the start of supply of the nitrogen gas in Step S46, the controller 3 controls the nitrogen supply section 50 to stop supplying the nitrogen gas. In response, the nitrogen supply section 50 stops supplying the nitrogen gas, thereby completing purging with the nitrogen gas. Step S48 may be referred to as "nitrogen gas purging step S48".

Next in Step S49, the controller 3 controls the pressure control valve 9 so that the degree of vacuum in the chamber 2 reaches the third degree VC3 of vacuum. In other words, the controller 3 controls the pressure control valve 9 so that the pressure in the chamber 2 reaches the third pressure P3 (FIG. 4). In response, the pressure control valve 9 sets the pressure in the chamber 2 to the third pressure P3. Step S49 may be referred to as "chamber pressure reduction step S49". After Step S49, the processing returns to the main routine in FIG. 5 and proceeds to Step S5.

As has been described with reference to FIGS. 5 to 7, according to the substrate processing method of the present embodiment, the two-step etching processing step S4 is executed the specific number NM of times (Step S5). Where the specific number NM is plural, the two-step etching processing step S4 is executed plural times. As such, the total amount of etching can be increased as compared with that in a case in which the two-step etching processing step S4 is performed one time.

In addition, each time the two-step etching processing step S4 in the present embodiment is executed, the first etching step S43 under the first pressure P1 is followed by the second etching step S47 under the second pressure P2 lower than the first pressure P1. As such, in the second etching step S47, the melting point and the boiling point of the reaction product, which is derived from the HF gas, on the silicon oxide film TG are lower than those in the first etching step S43. As a result, sublimation and exhaust of the reaction product on the silicon oxide film TG are promoted in the second etching step S47. Thus, influence of the reaction product on the second etching step S47 can be reduced to ensure reproducibility of amount of etching between the first etching step S43 and the second etching step S47. That is, reproducibility of etching result can be ensured even when the etching processing step on the same substrate is repeated plural times.

Furthermore, reproducibility of etching result can be ensured each time the two-step etching processing step S4 in the present embodiment is executed, with a result that reproducibility of etching result can be ensured even among plural-time execution of the two-step etching processing step S4. The above has been demonstrated in Example 2 which will be described later.

As a result of the above, in the present embodiment, plural-time execution of the two-step etching processing step S4 can increase the total amount of etching while reproducibility of etching result can be ensured even when the etching processing on the same substrate W is repeated plural times.

Note that the first etching step S43 and the second etching step S47 each are a part of the two-step etching processing step S4. Therefore, the first etching step S43 and the second etching step S47 constitute the two-step etching processing step S4.

(Variation)

Figure 8:
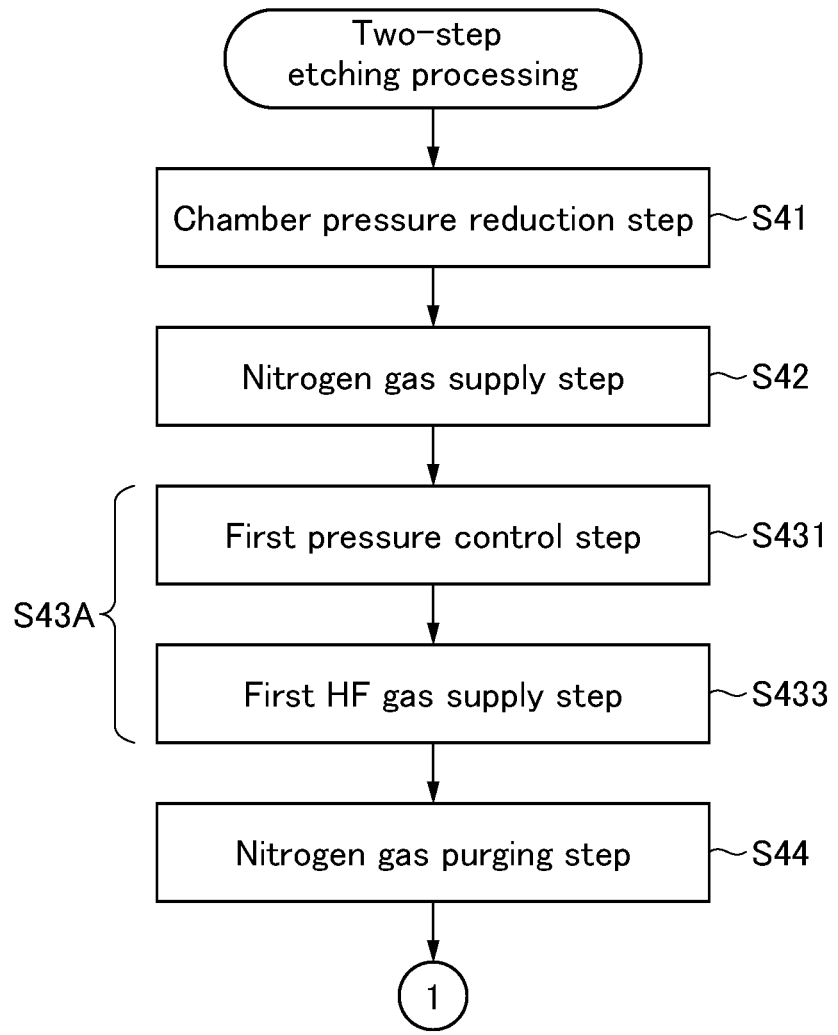
FIG. 8 is a flowchart depicting a former half of two-step etching processing according to a variation of the present embodiment.
Figure 9:
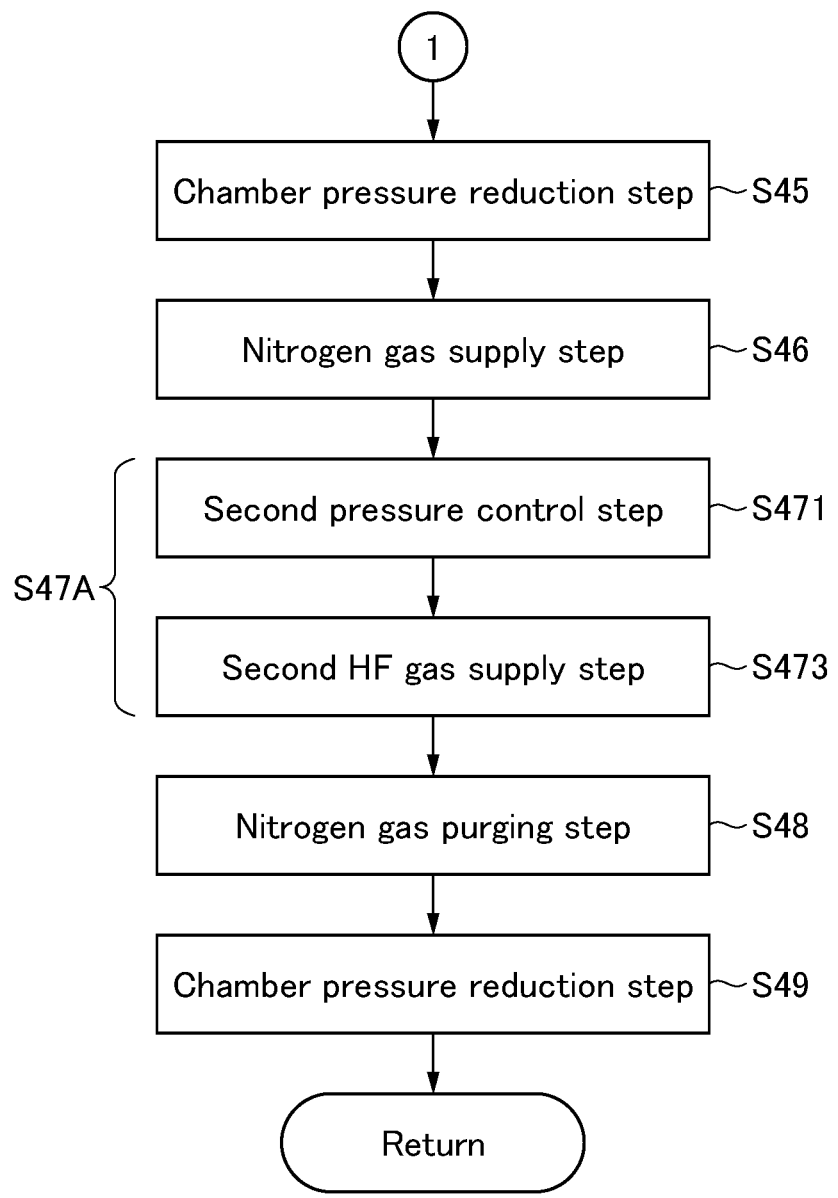
FIG. 9 is a flowchart depicting a latter half of the two-step etching processing according to the variation of the present embodiment.

The following describes a substrate processing apparatus 1 and a substrate processing method according to a variation of the present embodiment with reference to FIGS. 1, 8, and 9. The variation mainly differs from the above embodiment in that water vapor is not supplied into the chamber 2. The following mainly describes the difference of the variation from the above embodiment.

The substrate processing apparatus 1 according to the variation includes neither the water vapor supply section 30 nor the branch pipe 112 illustrated in FIG. 1. Alternatively, the water vapor supply section 30 of the substrate processing apparatus 1 according to the variation does not supply the water vapor into the chamber 2.

The substrate processing method according to the variation is the same as the substrate processing method depicted in FIG. 5. However, details of the two-step etching processing in Step S4 in the variation differs from the two-step etching processing depicted in FIGS. 6 and 7. The following mainly describes the difference.

FIGS. 8 and 9 are flowcharts depicting the two-step etching processing according to the variation. As depicted in FIGS. 8 and 9, the two-step etching processing in the variation corresponding to Step S4 in FIG. 5 includes Steps S41, S42, S43A, S44, S45, S46, S47A, S48, and S49. Steps S41, S42, S44, S45, S46, S48, and S49 in the variation are respectively the same as Steps S41, S42, S44, S45, S46, S48, and S49 depicted in FIGS. 6 and 7.

In the variation, Step S43A includes Steps S431 and S433 as depicted in FIG. 8. Steps S431 and S433 in the variation are the same as Steps S431 and S433 depicted in FIG. 6, respectively. However, the substrate processing method according to the variation does not include Step S432 depicted in FIG. 6. As such, the silicon oxide film TG formed on the substrate W is selectively etched against the another film FL with the HF gas in Step S433. Step S43A may be referred to as "first etching step S43A".

Specifically, the HF gas supplied into the chamber 2 through the gas supply pipe 11 passes through the gas dispersing plate 6 and reaches the substrate W as illustrated in FIG. 1. Further specifically, the HF gas supplied above the gas dispersing plate 6 in the chamber 2 passes through the openings 6H in the gas dispersing plate 6 and moves downward of the gas dispersing plate 6. The HF gas is rectified by passing through the openings 6H so as to be uniformly supplied onto the substrate W. The HF gas is preferably an anhydrous HF gas.

The HF gas flowing on the surface of the substrate W acts on the surface of the substrate W to etch the silicon oxide film TG. It is known that hydrogen fluoride ion ($HF_2^-$) mainly contributes to etching of the silicon oxide film TG. The $HF_2^-$ is generated through a reaction between the HF gas and moisture ($H_2O$) in the silicon oxide film TG.

In the above embodiment, not only the HF gas but also the water vapor is suppled into the chamber 2 to cause a reaction between the HF gas and the water vapor, thereby generating hydrogen fluoride ions. By contrast, the variation directs attention toward the moisture in the silicon oxide film TG and hydrogen fluoride ion is generated by supplying the HF gas into the chamber 2 to cause a reaction between the HF gas and the moisture in the silicon oxide film TG. Therefore, it is no need to supply water vapor into the chamber 2, thereby achieving reduction in running cost. Furthermore, the water vapor supply section 30 and the branch pipe 112 for supplying water vapor into the chamber 2 can be omitted. In this case, the size and manufacturing cost of the substrate processing apparatus 1 can be reduced.

In the variation, Step S47A includes Steps S471 and S473 as depicted in FIG. 9. Steps S471 and S473 in the variation are the same as Steps S471 and S473 depicted in FIG. 7, respectively. However, the substrate processing method according to the variation does not include step S472 depicted FIG. 7. Therefore, the HF gas supplied in Step S473 selectively etches the silicon oxide film TG formed on the substrate W against the another film FL. The principle of the etching is the same as that in Step S43A depicted in FIG. 8. Step S47A may be referred to as "second etching step S47A".

As described above with reference to FIGS. 8 and 9, the first etching step S43A and the second etching step S47 are executed in the variation likewise in the above-described embodiment. As a result, reproducibility of etching result can be ensured even when etching processing on the same substrate W is repeated plural times.

Although the present disclosure will be described next based on an example, the present disclosure is not limited to the following example.

EXAMPLE

Example 2 of the present disclosure will be described with reference to FIGS. 1, 5, 6, 7, and 10. The substrate processing apparatus 1 illustrated in FIG. 1 was used in Example 2. Furthermore, in Example 2, Step S4 (FIG. 5) of executing the two-step etching processing, that is, the two-step etching processing step S4 was executed twice (the specific number NM in Step S5 is 2).

In Example 2, the silicon oxide film TG formed on the substrate W was a LP-TEOS film. The silicon oxide film TG was etched with the HF gas.

Specifically, in the first etching step S43 (FIG. 6), the flow rate of the HF gas supplied into the chamber 2 from the HF supply mechanism 40 was 1 [slm]. The flow rate of the water vapor supplied into the chamber 2 from the water vapor supply section 30 was 1 [slm]. The flow rate of the nitrogen gas supplied into the chamber 2 from the nitrogen supply section 50 was 7 [slm]. The temperature of the substrate W was 100 (° C.). The pressure in the chamber 2 was 150 [Torr].

Furthermore, in the second etching step S47 (FIG. 6), the flow rate of the HF gas supplied into the chamber 2 from the HF supply mechanism 40 was 1.5 [slm]. The flow rate of the water vapor supplied into the chamber 2 from the water vapor supply section 30 was 2 [slm]. The flow rate of the nitrogen gas supplied into the chamber 2 from the nitrogen supply section 50 was 4 [slm]. The temperature of the substrate W was 100 (° C.). The pressure in the chamber 2 was 50 [Torr].

Figure 10:
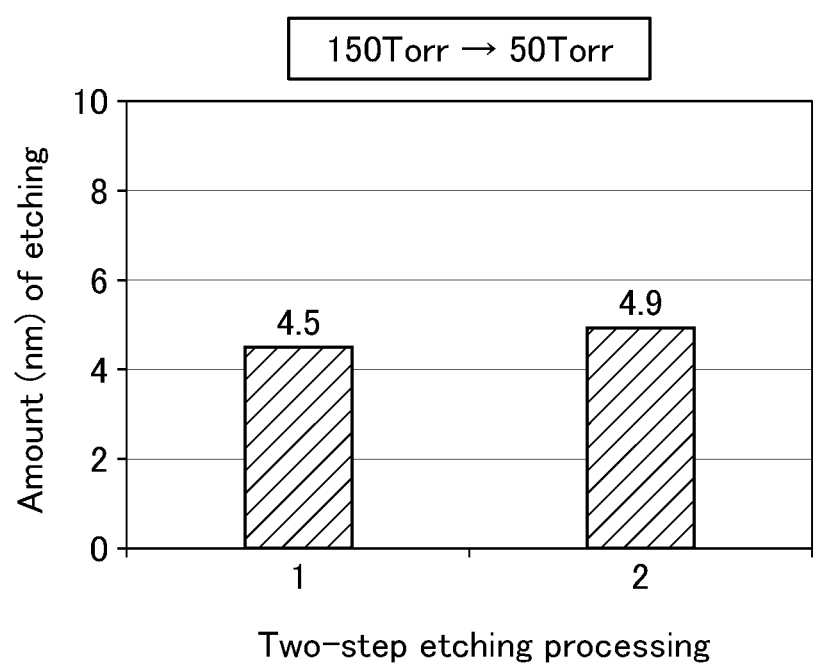
FIG. 10 is a graph representation showing amount of etching by two-step etching processing according to Example 2 of the present disclosure.

FIG. 10 is a graph representation showing amount of etching by the two-stage etching processing according to Example 2. The vertical axis indicates amount (nm) of etching. The horizontal axis indicates the order of the two-step etching processing.

In Example 2, the first-time two-step etching processing (horizontal axis "1") with the HF gas was carried out in the chamber 2. In this case, the first etching step S43 and the second etching step S47 were carried out with the substrate W held by the substrate holder 4.

Once the first-time two-step etching processing was completed, the substrate W was taken out of the chamber 2 and the film thickness of the silicon oxide film TG was measured. An amount of etching by the first-time two-step etching processing was calculated based on the result of the film thickness measurement. As a result, the amount of etching by the first-time two-step etching processing was 4.5 [nm]. The etching time was 540 seconds.

Next, the same substrate W, that is, the substrate W after the first-time two-step etching processing was returned into the chamber 2 and the second-time two-step etching processing (horizontal axis "2") was carried out under the same condition as those in the first-time two-step etching processing. After the second-time two-step etching processing was completed, the substrate W was taken out of the chamber 2 and the film thickness of the silicon oxide film TG was measured. An amount of etching by the second-time two-step etching processing was calculated based on the result of the film thickness measurement. As a result, the amount of etching by the second-time two-step etching processing was 4.9 [nm]. The etching time was 540 seconds.

The difference between the amount of etching by the first-time two-step etching processing and the amount of etching by the second-time two-step etching processing was 0.4 [nm]. As such, when the pressure in the chamber 2 in the second etching step S47 was set to 50 [Torr] each time (two times) the two-step etching processing step S4 was carried out, reproducibility of amount of etching between the first-time two-step etching processing and the second-time two-step etching processing was ensured.

An embodiment of the present disclosure has been described so far with reference to the drawings. However, the present disclosure is not limited to the above embodiment and can be implemented in various forms within a scope not departing from the gist thereof. Also, the elements of configuration disclosed in the above embodiment can be altered as appropriate. For example, some of all the elements of configuration indicated in an embodiment may be added to elements of configuration in another embodiment. Alternatively, some of all the elements of configuration indicated in an embodiment may be removed from the embodiment.

The drawings schematically illustrate elements of configuration in order to facilitate understanding, and properties of the elements of configuration illustrated in the drawings, such as thickness, length, number, and intervals thereof, may differ from actual properties thereof in order to facilitate preparation of the drawings. In addition, each element of configuration indicated in the above embodiment is an example and not limited specifically. It is needless to say that various alterations thereof are possible within a range substantially not departing from the effects of the present disclosure.

What is claimed is:

1. A substrate processing method for etching a silicon oxide film formed on a substrate, comprising:
    performing a first selective etching process to selectively etch the silicon oxide film while maintaining another film by supplying a hydrogen fluoride gas into a chamber in a state in which a pressure in the chamber is a first pressure lower than an atmospheric pressure; and
    performing a second selective etching process to selectively etch the silicon oxide film while maintaining the another film by supplying the hydrogen fluoride gas into the chamber in a state in which the pressure in the chamber is a second pressure lower than the atmospheric pressure, wherein
    the first pressure is not greater than 600 Torr and is not lower than 100 Torr,
    the second pressure is not greater than 50 Torr,
    in the second selective etching process, a melting point and a boiling point of a reaction product generated in the first selective etching process and remaining on the silicon oxide film are lowered, and in the second selective etching process, the silicon oxide film is etched while the reaction product remaining on the silicon oxide film is sublimated.

2. The substrate processing method according to claim 1, wherein
the first selective etching process and the second selective etching process constitute a two-step etching process, and
the two-step etching process is executed plural times.

* * * * *